(12) United States Patent
Xiong et al.

(10) Patent No.: US 7,944,733 B2
(45) Date of Patent: May 17, 2011

(54) STATIC RANDOM ACCESS MEMORY (SRAM) OF SELF-TRACKING DATA IN A READ OPERATION, AND METHOD THEREOF

(75) Inventors: Jianjun Xiong, Mountain View, CA (US); Jing Guo, Shanghai (CN)

(73) Assignee: NVIDIA Corporation, Santa Clara, CA (US)

( * ) Notice: Subject to any disclaimer, the term of this patent is extended or adjusted under 35 U.S.C. 154(b) by 125 days.

(21) Appl. No.: 12/256,335

(22) Filed: Oct. 22, 2008

(65) Prior Publication Data
US 2010/0034029 A1    Feb. 11, 2010

(51) Int. Cl.
*G11C 11/00* (2006.01)
(52) U.S. Cl. .................. 365/154; 365/189.15; 365/207; 365/210.1
(58) Field of Classification Search .................. 365/154, 365/189.011, 189.02, 189.15, 191, 207, 210.1
See application file for complete search history.

(56) References Cited

U.S. PATENT DOCUMENTS

| | | | | |
|---|---|---|---|---|
| 6,903,973 B2 * | 6/2005 | Suzuki et al. | .............. | 365/185.2 |
| 6,950,362 B2 * | 9/2005 | Kurumada et al. | ........ | 365/210.1 |
| 7,577,049 B1 * | 8/2009 | Kornachuk | ................... | 365/196 |

* cited by examiner

*Primary Examiner* — VanThu Nguyen
(74) *Attorney, Agent, or Firm* — Patterson & Sheridan, LLP

(57) ABSTRACT

A system and method for self-tracking data in a read operation of a SRAM are disclosed. The self-tracking data selection SRAM comprises: a plurality of memory cell arrays, comprising: a plurality of memory cells each generating a first signal and outputting a first read data; a plurality of first buffers each receiving the first signal outputting a second signal; a first multiplexer receiving the plurality of first read data and the first signals; a plurality of second buffers each receiving the second signals and outputting a third signal; and a second multiplexer receiving a plurality of second read data from the plurality of memory cell arrays and outputting a third signals.

20 Claims, 7 Drawing Sheets

STATIC RANDOM ACCESS MEMORY (SRAM) OF SELF-TRACKING DATA IN A READ OPERATION, AND METHOD THEREOF

CROSS-REFERENCE TO RELATED APPLICATIONS

This application claims benefit of Chinese (PRC) patent application number 200810131284.2, filed Aug. 5, 2008, which is herein incorporated by reference.

FIELD OF INVENTION

The present invention generally relates to a semiconductor memory device, and more particularly to a read operation of a static random access memory (SRAM).

BACKGROUND

Traditionally, a basic block diagram of a SRAM used in a read operation comprises a decoder 1, a RAM_Core 2, a controller 3, and a sense amplifier 4 (as shown in FIG. 1). The RAM_Core 2 comprises a plurality of arrays of memory cells. The controller 3 receives different signals such as an address signal or other circuit signals, and then outputs the signals to the decoder 1. The RAM_Core 2 receives a word line (WL) data, and outputs a bit_line (BL) data as well as a bit_line_bar (BLB) data to the sense amplifier 4. Once the sense amplifier 4 receives an effective sense amplifier enable (SAE) signal from the controller 3, it will output a read data of a memory cell.

FIG. 2 shows a timing diagram showing the read operation of the SRAM of FIG. 1. The WL signal is effective after a rising edge of a clock (CLK) signal with a fixed time delay. The BL/BLB signal starts to discharge after the WL signal is effective. After a differential voltage is setup on BL/BLB, the SAE signal is effective. Then, the read data of memory cell 0 (RD_M0) is available after a rising edge of the SAE signal with a fixed time delay.

FIG. 3 illustrates a block diagram of a 16 k*64 b SRAM used in a traditional read operation. The SRAM comprises a first array 16, a second array 17, a third array 18 and a fourth array 19 of memory cells, wherein each array of memory cells comprises memory cell 0, memory cell 1, memory cell 2, and memory cell 3. In FIG. 3, reference numerals 12, 13, 14 and 15 are used to show memory cell 0, memory cell 1, memory cell 2, and memory cell 3, respectively. A first 2-to-4 decoder 10 decodes address (ADR1) signals to generate selection signals SI<0>, SI<1>, SI<2>, and SI<3>. SI<0>, SI<1>, SI<2>, and SI<3> are inputted to a first 4-to-1 multiplexer 20. Four read data RD_M0<63:0>, RD_M1<63:0>, RD_M2<63: 0>, and RD_M3<63:0> of memory cell 0, memory cell 1, memory cell 2, and memory cell 3 in the first array 16 of memory cells are inputted to the first 4-to-1 multiplexer 20. Then, the first 4-to-1 multiplexer 20 outputs a read data RD_P0<63:0> of the first array 16 of memory cells. Similarly, a second 4-to-1 multiplexer 21, a third 4-to-1 multiplexer 22, and a fourth 4-to-1 multiplexer 23, are used in turn to output read data RD_P1<63:0>, RD_P2<63:0>, and RD_P3<63:0> of the second array 17, the third array 18, and the fourth array 19 of memory cells.

In the same way, a second 2-to-4 decoder 11 decodes address (ADR2) signals to generate selection signals S<0>, S<1>, S<2>, and S<3>. S<0>, S<1>, S<2>, and S<3> are inputted to a fifth 4-to-1 multiplexer 24. The fifth 4-to-1 multiplexer 24 also receives read data RD_P0<63:0>, RD_P1<63:0>, RD_P2<63:0>, and RD_P3<63:0> from the outputs of the first 4-to-1 multiplexer 20, the second 4-to-1 multiplexer 21, the third 4-to-1 multiplexer 22, and the fourth 4-to-1 multiplexer 23, respectively. By selecting a particular selection signal, the fifth 4-to-1 multiplexer 24 outputs a read data RD<63:0> of the SRAM.

FIG. 4 illustrates a timing diagram showing the read operation of the traditional SRAM of FIG. 3. Since a rising edge of the selection signal SI<0> occurs before the stability of the read data RD_M0<0>, the read data RD_P0<0> between the rising edge of the selection signal SI<0> and the stability of the read data RD_M0<0> are invalid. A data bus will toggle for the above invalid data, and thus consumes power significantly. For the same reason, another unwanted toggle will subsequently occur for the invalid data of RD<0>.

FIG. 5 is a block diagram of a 16 k*64 b SRAM that employs a different data selection scheme. All read operations in FIG. 3 and FIG. 5 are the same except the generation of the selection signals. As illustrated in FIG. 5, an address decoding signal ADR_dec and a pulse are inputted to an AND gate so as to generate a selection signal.

FIG. 6 is a timing diagram showing a read operation of the SRAM of FIG. 5. A pulse 1 needs to be well designed, thereby making a rising edge of the pulse 1 occur after the stability of the read data RD_M0<0>. Due to the time delay of the AND gate, a rising edge of the selection signal SI<0> occurs after the rising edge of the pulse 1. Since the rising edge of the selection signal SI<0> occurs after the stability of the read data RD_M0<0>, the read data RD_P0<0> will not toggle.

Referring again to FIG. 6, likewise, a pulse 2 is well designed so that its rising edge occur after the stability of the read data RD_P0<0>. For the same reason, a rising edge of the selection signal S<0> occurs after the rising edge of the pulse 2. Again, since the rising edge of the selection signal S<0> occurs after the stability of the read data RD_P0<0>, the read data RD<0> will not toggle. In FIG. 6, if the rising edge of the selection signal SI<0> comes before the stability of the read data RD_M0<0>, an invalid data will occur on the read data RD_P0<0>. Similarly, if the rising edge of the selection signal S<0> comes before the stability of the read data RD_P0<0>, an invalid data will occur on the read data RD<0>. It is even worse that if the correct read data are not stable before a falling edge of the selection signal, the wrong data will be read out. Another problem in the traditional SRAM is that if the pulse is over designed to make it come later than the stability of the read data, the timing performance is sacrificed.

SUMMARY OF INVENTION

An embodiment of the present invention provides a method for self-tracking data in a read operation of a SRAM to prevent occurrence of invalid data and excessive timing margin in a read operation of a SRAM met in the prior art. The SRAM comprises a plurality of arrays of memory cells and each array of memory cells comprises a plurality of memory cells. A method for self-tracking data in a read operation of the SRAM comprises the steps of: each memory cell in an array of memory cells of the SRAM outputting a first signal; buffering the first signal with a first buffer to generate a second signal, and then inputting the second signal to the first multiplexer; the each memory cell in the array of memory cells outputting a first read data to the first multiplexer; the first multiplexer outputting a second read data of the array of memory cells; inputting a plurality of the first signals generated by the array of memory cells to a second buffer to generate a third signal; inputting the second read data of the array of memory cells and the third signal to a second multiplexer; and the second multiplexer outputting a third read data.

According to the embodiment of the present invention, the invalid data are not generated. Without the generation of the invalid data, toggling will not occur. As a result, power dissipation will be significantly reduced in the read operation of the SRAM.

Another embodiment of the present invention provides a self-tracking data selection SRAM, which comprises: a plurality of memory cell arrays, comprising: a plurality of memory cells each generating a first signal and outputting a first read data; a plurality of first buffers each receiving the first signal outputting a second signal; a first multiplexer receiving the plurality of first read data and the first signals; a plurality of second buffers each receiving the second signals and outputting a third signal; and a second multiplexer receiving a plurality of second read data from the plurality of memory cell arrays and outputting a third signals.

DETAILED DESCRIPTION OF THE INVENTION

Figure 1:
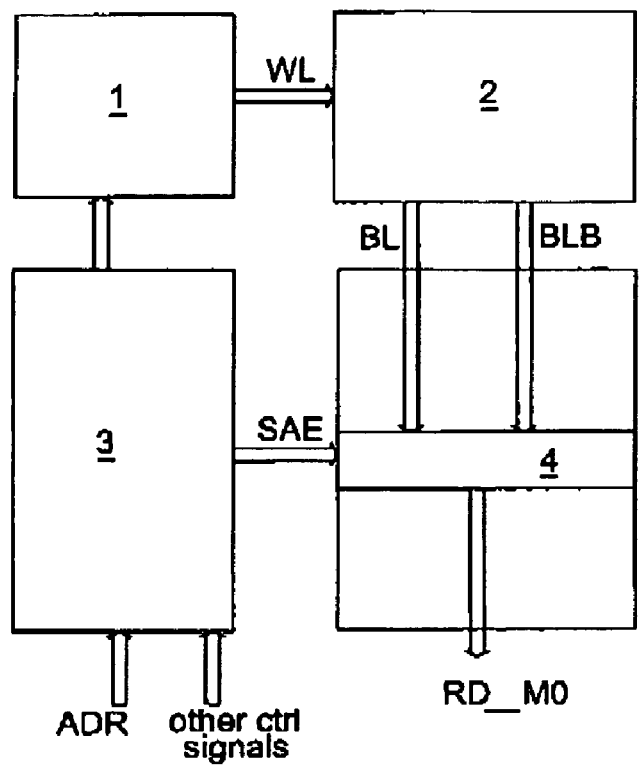
FIG. 1 shows a basic block diagram of a traditional SRAM used in a read operation.
Figure 2:
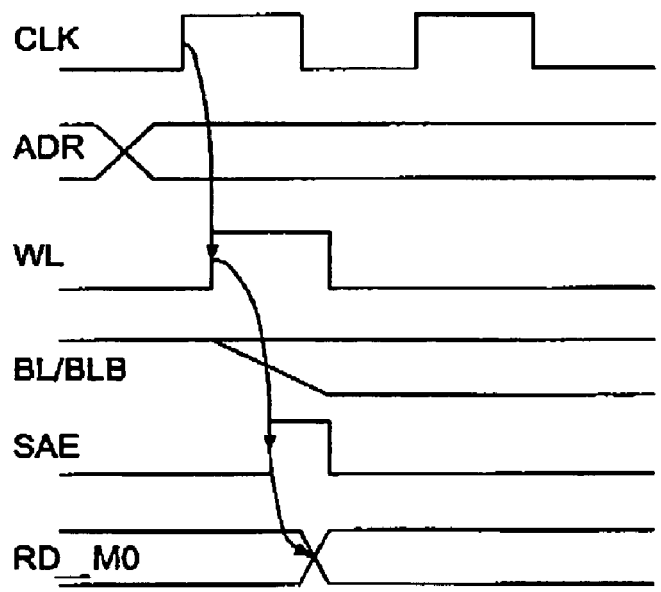
FIG. 2 is a timing diagram showing the read operation of the SRAM in accordance with FIG. 1.
Figure 3:
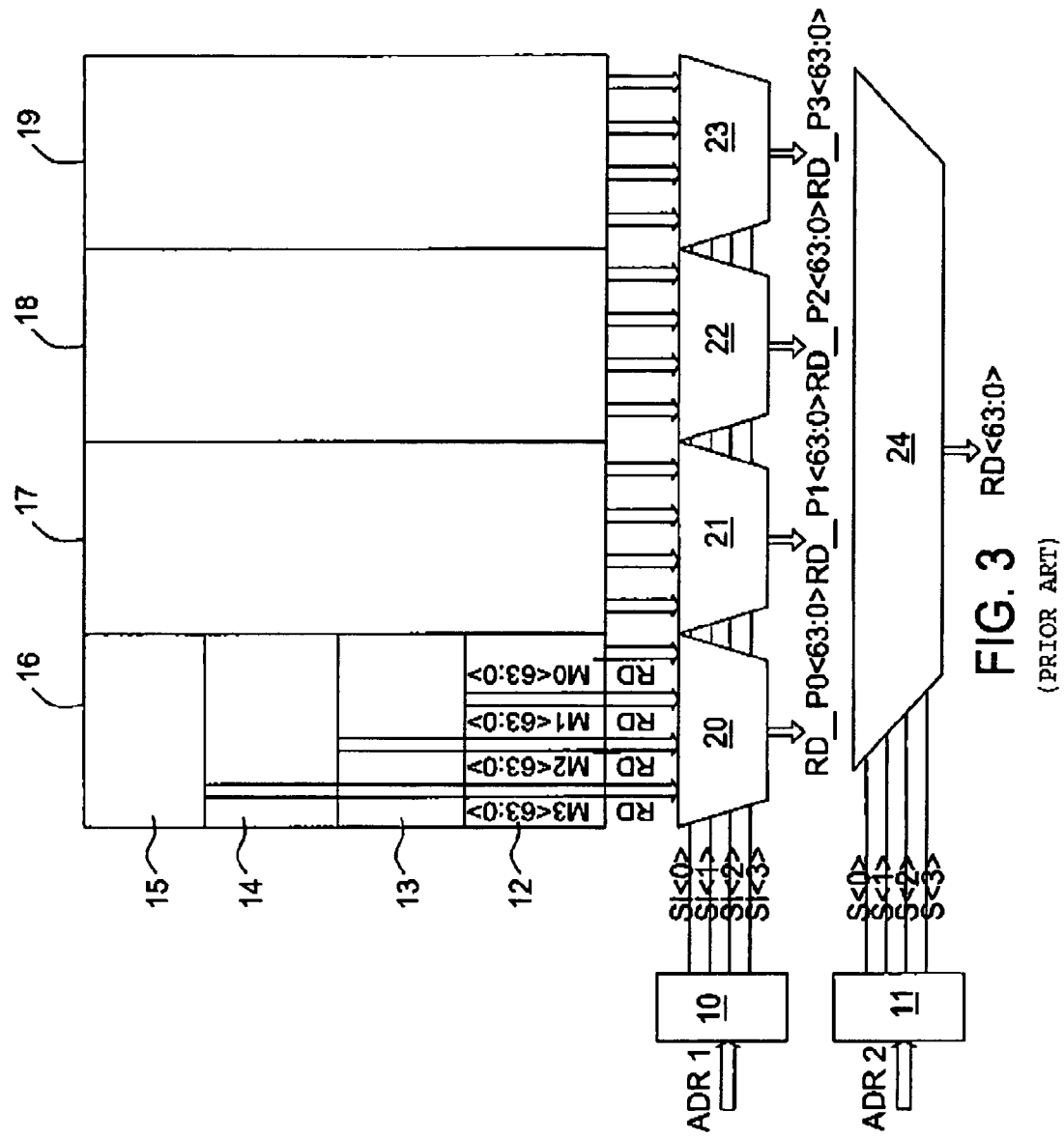
FIG. 3 is a block diagram of a 16 k*64 b SRAM used in a conventional read operation.
Figure 4:
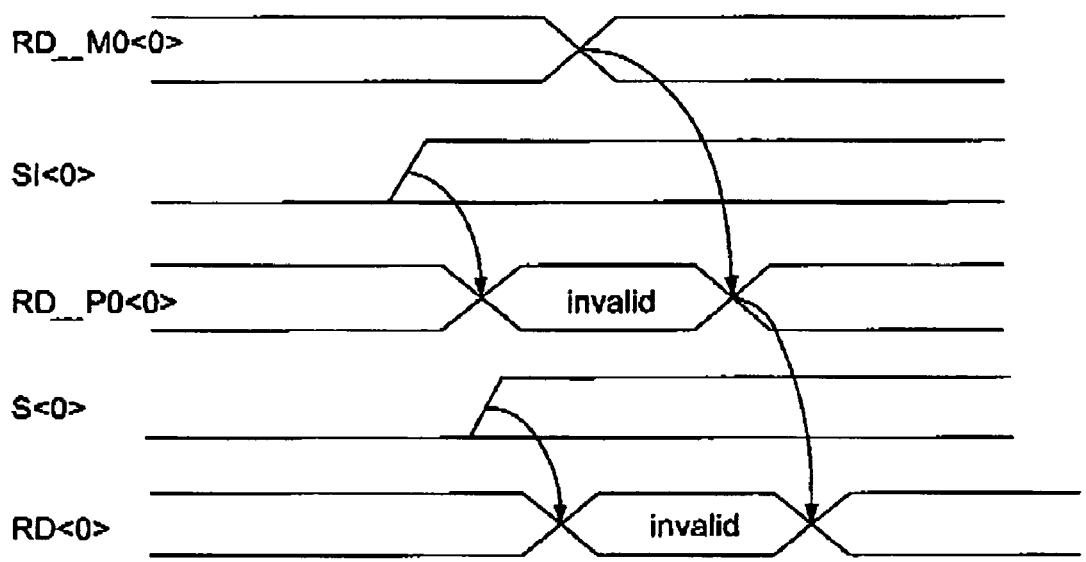
FIG. 4 is a timing diagram showing the read operation of the SRAM of FIG. 3.
Figure 5:
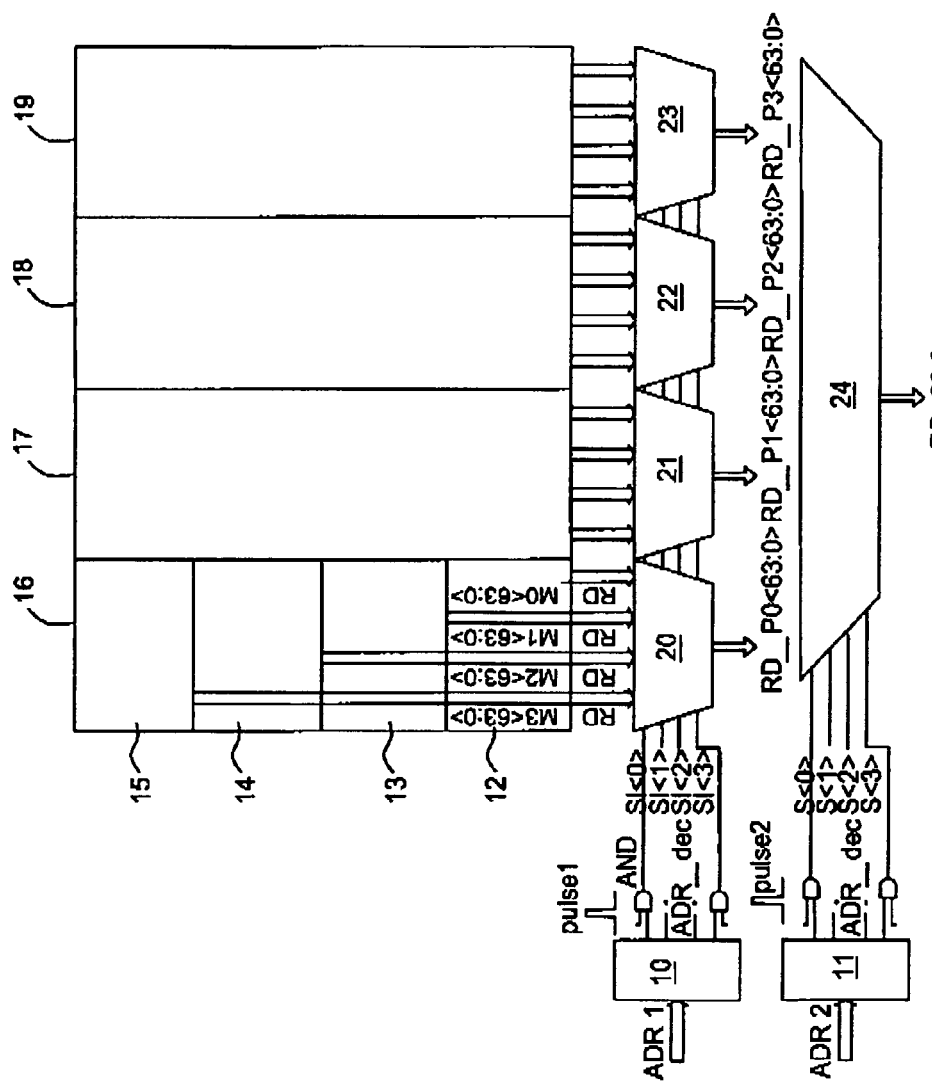
FIG. 5 is a block diagram of a 16 k*64 b SRAM also used in a conventional read operation.
Figure 6:
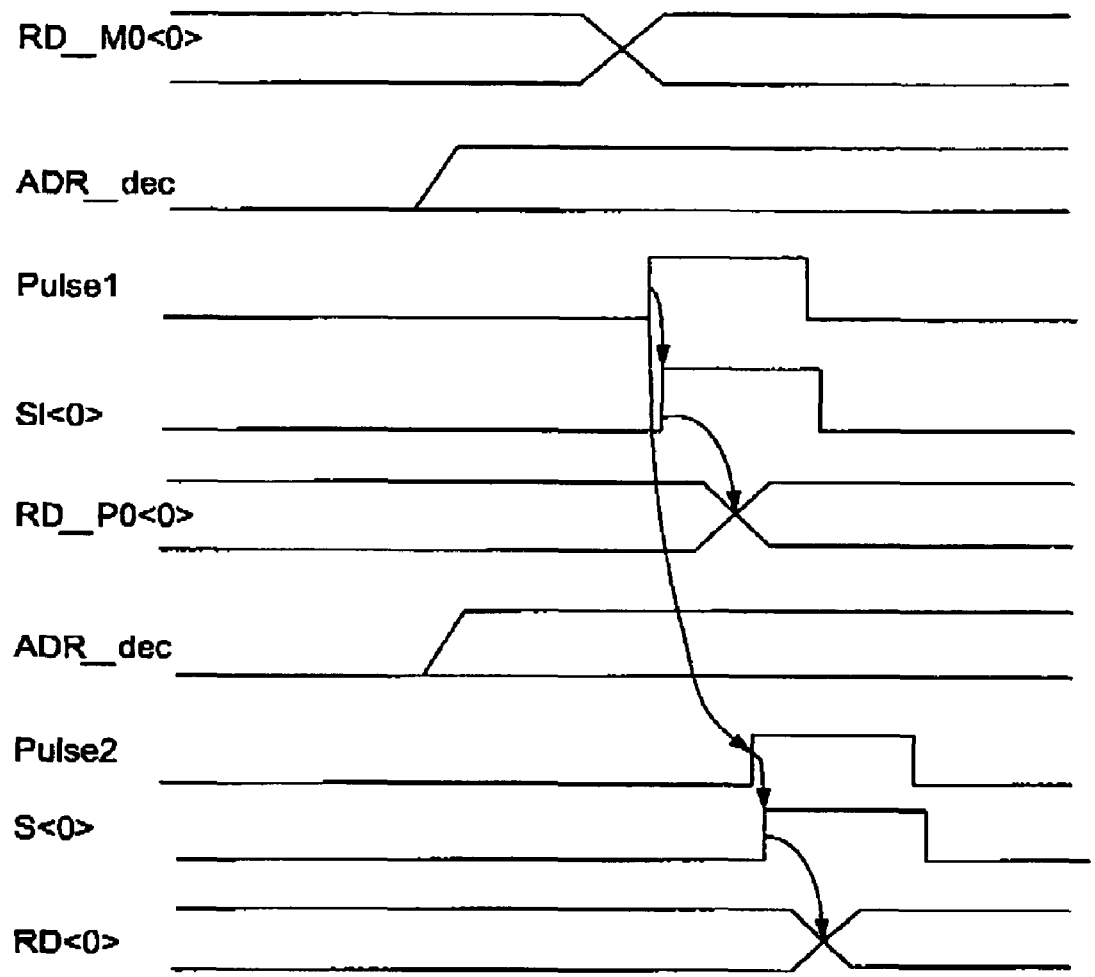
FIG. 6 is a timing diagram showing the read operation of the SRAM of FIG. 5.
Figure 7:
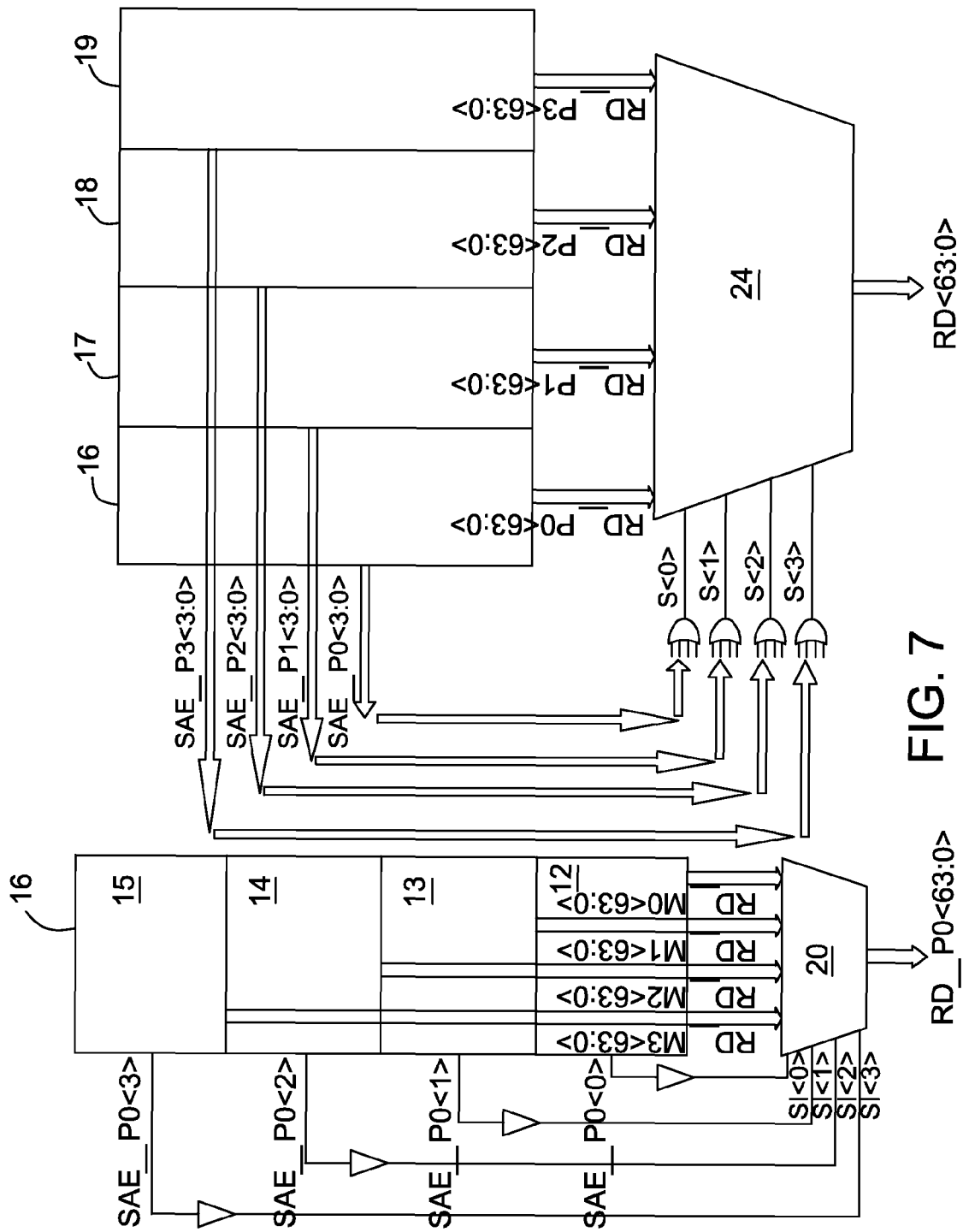
FIG. 7 is a block diagram of a 16 k*64 b SRAM used for self-tracking data in a read operation according to the present invention.

An embodiment of a block diagram of a 16 k*64 b SRAM used for self-tracking data in a read operation according to the present invention is shown in FIG. 7. In the embodiment, the SRAM comprises a first array 16, a second array 17, a third array 18, and a fourth array 19 of memory cells, wherein each array of memory cells comprises memory cell 0, memory cell 1, memory cell 2, and memory cell 3. As shown in a left portion of FIG. 7, reference numerals 12, 13, 14 and 15 are used to indicate memory cell 0, memory cell 1, memory cell 2, and memory cell 3 in the first array 16 of memory cells, respectively. Four SAE signals SAE_P0<3>, SAE_P0<2>, SAE_P0<1>, SAE_P0<0> from memory cell 3, memory cell 2, memory cell 1, and memory cell 0 in the first array 16 of memory cells are inputted to a buffer, and outputted as selection signals SI<3>, SI<2>, SI<1>, and SI<0>, respectively. Four read data of memory cell 0, memory cell 1, memory cell 2, and memory cell 3 in the first array 16 of memory cells are inputted to a first 4-to-1 multiplexer 20. Then, the first 4-to-1 multiplexer 20 outputs the read data RD_P0<63:0> of the first array 16 of memory cells. Similarly, read data RD_P1<63:0>, RD_P2<63:0>, and RD_P3<63:0> are in turn generated for the second array 17, the third array 18, and the fourth array 19 of memory cells.

Four SAE signals from memory cell 0, memory cell 1, memory cell 2, and memory cell 3 of the first array 16 of memory cells are inputted to an OR gate so as to generate a selection signal S<0>. Similarly, selection signals S<1>, S<2>, and S<3> are created. Four selection signals S<0>, S<1>, S<2>, and S<3> are inputted to a 4-to-1 multiplexer 24. The 4-to-1 multiplexer 24 also receives read data RD_P0<63:0>, RD_P1<63:0>, RD_P2<63:0>, and RD_P0<63:0> in order from the outputs of the 4-to-1 multiplexers 20. Additional three 4-to-1 multiplexers for the first array 16 of the memory cells are not shown in FIG. 7. By selecting a particular selection signal, the 4-to-1 multiplexer 24 outputs a read data RD<63:0> of the SRAM.

Figure 8:
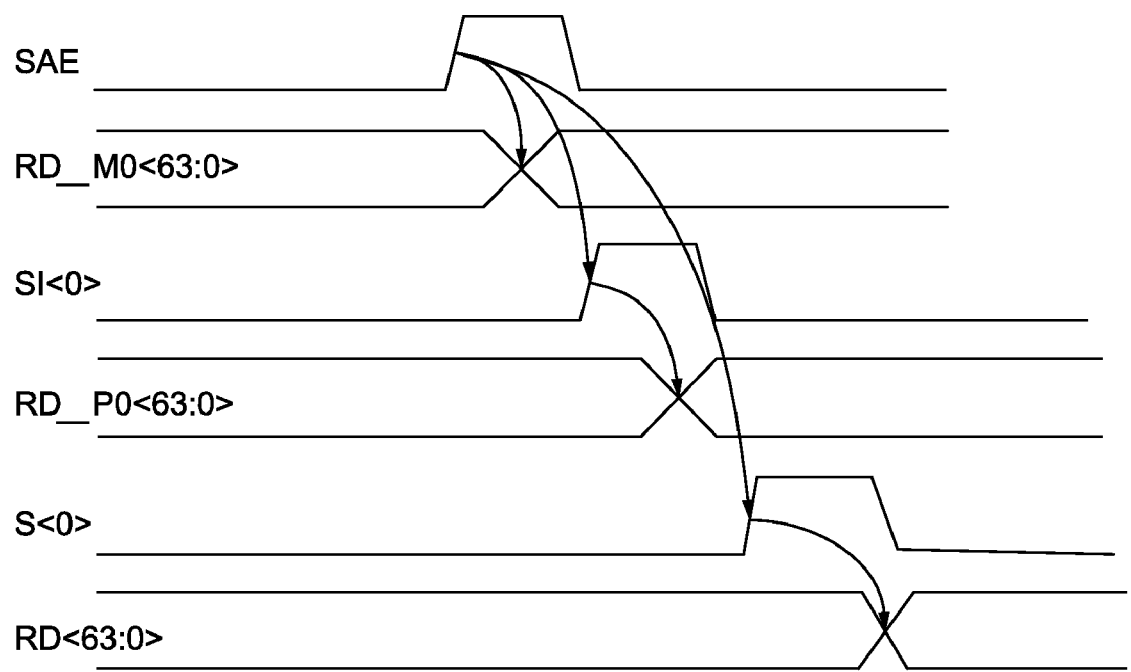
FIG. 8 is a timing diagram of the SRAM of FIG. 7.

A timing diagram of the SRAM of FIG. 7 is illustrated in FIG. 8. At first, a SAE signal is created. The SAE signal is a pulse, and its rising edge occurs before the stability of the read data RD_M0<63:0> of memory cell 0. However, after a time delay of buffering by a predetermined time, a rising edge of the selection signal SI<0> comes after the stability of the read data RD_M0<63:0>. Thus, there is no invalid data on the read data RD_P0<63:0>. Similarly, a rising edge of the selection signal S<0> comes after the stability of the read data RD_P0<63:0>. As a result, there is no invalid data on the read data RD<63:0>.

Although the embodiments disclosed above are discussed in the scope of providing solutions in response to a need for read operation of the SRAM data, one of ordinary skill in the art can easily adopt the same self-tracking method or SRAM according to the present invention for the providing of other type of purposes. Variations, modifications, and other implementations of what is described herein will occur to those of ordinary skill in the art without departing from the spirit and scope of the present invention as claimed. Accordingly, the present invention is to be defined not by the preceding illustrative description but instead by the spirit and scope of the following claims.

What is claimed is:

1. A method for self-tracking data in a read operation of a static random access memory (SRAM), the method comprising the steps of:

each memory cell in an array of memory cells of the SRAM outputting a first signal;

buffering the first signal with a first buffer to generate a second signal, and then inputting the second signal to a first multiplexer;

the each memory cell in the array of memory cells outputting first read data to the first multiplexer;

the first multiplexer outputting second read data of the array of memory cells;

inputting a plurality of the first signals generated by the array of memory cells to a second buffer to generate a third signal;

inputting the second read data of the array of memory cells and the third signal to a second multiplexer; and the second multiplexer outputting third read data.

2. The method according to claim 1, wherein the first buffer delays the first signal by a predetermined time to generate the second signal.

3. The method according to claim 1, wherein the second buffer delays the second signal by a predetermined time to generate the third signal.

4. The method according to claim 1, the first multiplexer outputs one of the first read data from one of the each memory cells in the array of memory cells based on the second signals.

5. The method according to claim 1, the second multiplexer outputs one of the second read data from one of the each memory cells in the array of memory cells based on the third signals.

6. The method according to claim 1, wherein the first signal is a sense amplifier enable signal.

7. The method according to claim 1, wherein the second signal is a selection signal.

8. The method according to claim 1, wherein the third signal is a selection signal.

9. The method according to claim 1, wherein the first or the second buffer is an OR gate.

10. The method according to claim 6, wherein a rising edge of the sense amplifier enable signal occurs before the stability of the first read data of the memory cell.

11. The method according to claim 7, wherein a rising edge of the selection signal occurs after the stability of the first read data of the memory cell.

12. The method according to claim 7, wherein the rising edge of the selection signal occurs before the stability of the second read data of the array of memory cells.

13. The method according to claim 8, wherein a rising edge of the selection signal occurs after the stability of the second read data of the array of memory cells.

14. A self-tracking data selection SRAM, comprising:
a plurality of memory cell arrays, comprising:
a plurality of memory cells each generating a first signal and outputting first read data;
a plurality of first buffers each receiving the first signal outputting a second signal;
a first multiplexer receiving the first read data and the first signals;
a plurality of second buffers each receiving the second signal and outputting a third signal; and
a second multiplexer receiving second read data from the plurality of memory cell arrays and outputting a third signal.

15. The self-tracking data selection SRAM according to claim 14, wherein each of the plurality of first buffer delays the first signal by a predetermined time to generate the second signal.

16. The self-tracking data selection SRAM according to claim 14, wherein each of the plurality of second buffer delays the second signal by a predetermined time to generate the third signal.

17. The self-tracking data selection SRAM according to claim 14, wherein the first multiplexer outputs one of the first read data from one of the plurality of memory cells based on the second signals.

18. The self-tracking data selection SRAM according to claim 14, wherein the second multiplexer outputs one of the second read data from one of the plurality of memory cells based on the third signals.

19. The self-tracking data selection SRAM according to claim 14, wherein the first or the second buffer is an OR gate.

20. The self-tracking data selection SRAM according to claim 14, wherein the SRAM comprises four of memory cell arrays and each comprises four memory cells and the first or the second multiplexer is a 4-to-1 multiplexer.

* * * * *

UNITED STATES PATENT AND TRADEMARK OFFICE
CERTIFICATE OF CORRECTION

PATENT NO. : 7,944,733 B2  Page 1 of 1
APPLICATION NO. : 12/256335
DATED : May 17, 2011
INVENTOR(S) : Jianjun Xiong and Jing Guo It is certified that error appears in the above-identified patent and that said Letters Patent is hereby corrected as shown below:

On the Title Page, add item (30) as follows:

Item --(30)   Foreign Application Priority Data
Aug. 5, 2008   (CN).....................................2008-10131284.2--

Signed and Sealed this
Ninth Day of August, 2011

David J. Kappos
*Director of the United States Patent and Trademark Office*